(12) United States Patent
Brenninger

(10) Patent No.: US 9,018,021 B2
(45) Date of Patent: Apr. 28, 2015

(54) METHOD AND APPARATUS FOR DEPOSITING A LAYER ON A SEMICONDUCTOR WAFER BY VAPOR DEPOSITION IN A PROCESS CHAMBER

(75) Inventor: Georg Brenninger, Oberbergkirchen (DE)

(73) Assignee: Siltronic AG, Munich (DE)

( * ) Notice: Subject to any disclaimer, the term of this patent is extended or adjusted under 35 U.S.C. 154(b) by 228 days.

(21) Appl. No.: 13/603,939

(22) Filed: Sep. 5, 2012

(65) Prior Publication Data
US 2013/0078743 A1    Mar. 28, 2013

(30) Foreign Application Priority Data

Sep. 22, 2011  (DE) .......................... 10 2011 083 245

(51) Int. Cl.
| | | |
|---|---|---|
| H01L 21/00 | (2006.01) | |
| C23C 16/24 | (2006.01) | |
| C30B 25/10 | (2006.01) | |
| C23C 16/46 | (2006.01) | |
| C23C 16/52 | (2006.01) | |
| C30B 25/16 | (2006.01) | |
| C30B 29/06 | (2006.01) | |
| G01R 31/26 | (2014.01) | |
| H01L 21/66 | (2006.01) | |
| H01L 21/20 | (2006.01) | |
| H01L 21/36 | (2006.01) | |
| H01L 33/00 | (2010.01) | |
| H01L 21/31 | (2006.01) | |
| H01L 21/469 | (2006.01) | |

(52) U.S. Cl.
CPC ................. *C23C 16/24* (2013.01); *C30B 25/10* (2013.01); *C23C 16/46* (2013.01); *C23C 16/52* (2013.01); *C30B 25/16* (2013.01); *C30B 29/06* (2013.01)

(58) Field of Classification Search
None
See application file for complete search history.

(56) References Cited

U.S. PATENT DOCUMENTS

| | | | |
|---|---|---|---|
| 5,167,716 A | 12/1992 | Boitnott et al. | |
| 6,036,877 A | 3/2000 | Collins et al. | |
| 6,083,323 A | 7/2000 | Carlson et al. | |
| 2003/0027364 A1* | 2/2003 | Ikeda ............... | 438/14 |
| 2003/0045961 A1* | 3/2003 | Nakao ............... | 700/121 |
| 2006/0154453 A1* | 7/2006 | Son et al. .......... | 438/482 |
| 2007/0042117 A1 | 2/2007 | Kuppurao et al. | |
| 2008/0138917 A1* | 6/2008 | Verhaverbeke et al. ........ | 438/16 |
| 2008/0210163 A1 | 9/2008 | Carlson et al. | |
| 2010/0213168 A1 | 8/2010 | Haberecht | |
| 2011/0185970 A1* | 8/2011 | Surthi .............. | 118/704 |

FOREIGN PATENT DOCUMENTS

| | | |
|---|---|---|
| DE | 691 20 193 T2 | 4/1992 |
| EP | 0808917 A1 | 11/1997 |

(Continued)

*Primary Examiner* — Calvin Choi
(74) *Attorney, Agent, or Firm* — Brooks Kushman P.C.

(57) ABSTRACT

A layer is deposited onto a semiconductor wafer by CVD in a process chamber having upper and lower covers, wherein the wafer front side temperature is measured; the wafer is heated to deposition temperature; the temperature of the upper process chamber cover is controlled to a target temperature by measuring the temperature of the center of the outer surface of the upper cover as the value of a controlled variable of an upper cover temperature control loop; a gas flow rate of process gas for depositing the layer is set; and a layer is deposited on the heated wafer front side during control of the upper cover temperature to the target temperature. A process chamber suitable therefor has a sensor for measuring the upper cover outer surface center temperature and a controller for controlling this temperature to a predetermined value.

8 Claims, 1 Drawing Sheet

(56) References Cited

FOREIGN PATENT DOCUMENTS

| | | |
|---|---|---|
| JP | 2004039743 A | 2/2004 |
| KR | 10-2004-0085267 | 10/2004 |
| KR | 10-2010-0097011 | 9/2010 |
| TW | 200835892 A | 9/2008 |
| WO | 02/18670 A2 | 3/2002 |
| WO | 2007/040908 A2 | 4/2007 |
| WO | 2007/040916 A2 | 4/2007 |

* cited by examiner

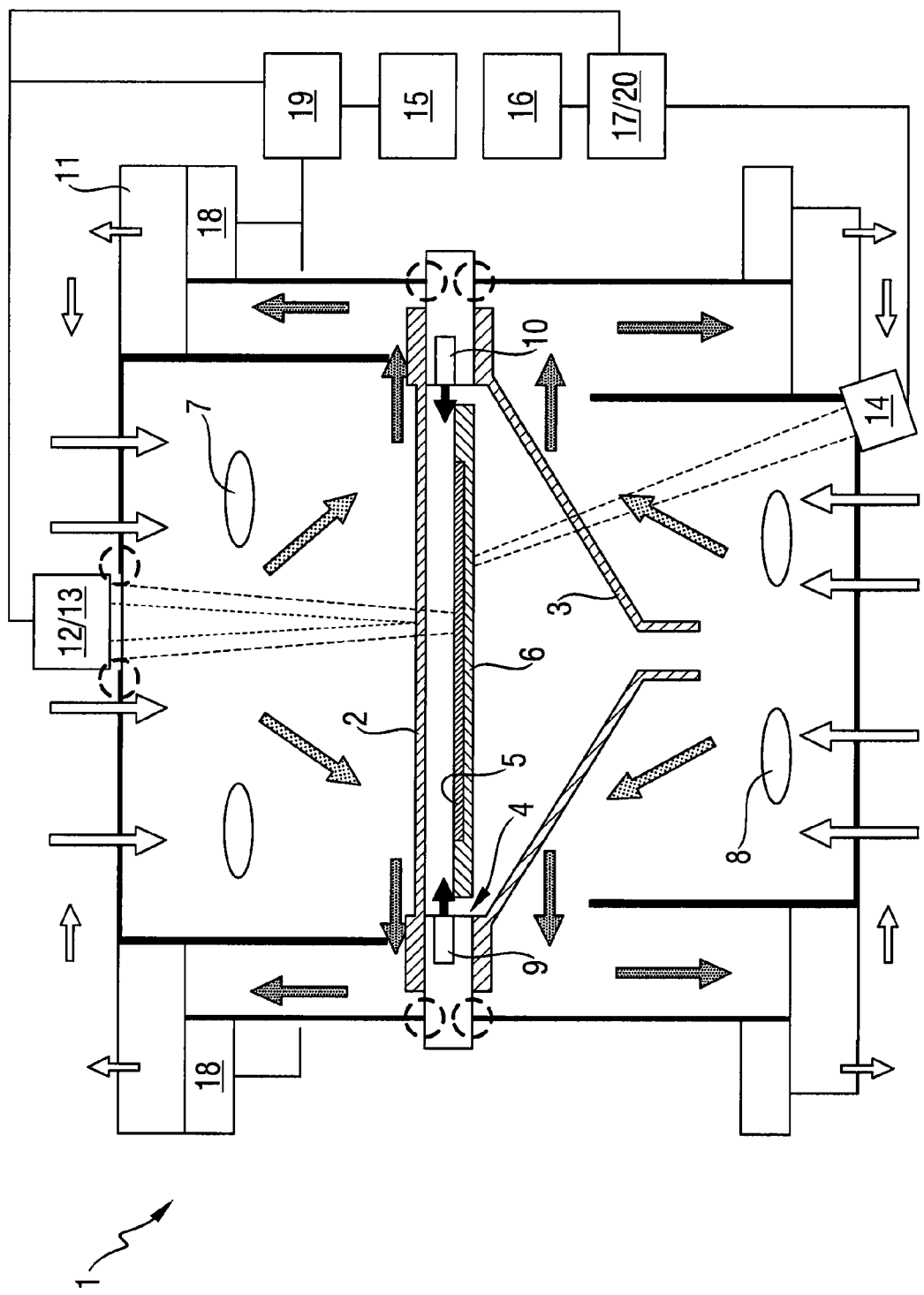

US 9,018,021 B2

METHOD AND APPARATUS FOR DEPOSITING A LAYER ON A SEMICONDUCTOR WAFER BY VAPOR DEPOSITION IN A PROCESS CHAMBER

CROSS-REFERENCE TO RELATED APPLICATIONS

This application claims priority to German Patent Application No. DE 10 2011 083 245.9, filed Sep. 22, 2011, which is herein incorporated by reference.

BACKGROUND OF THE INVENTION

1. Field of the Invention

The present invention relates to a method and to an apparatus for depositing a layer on a semiconductor wafer by vapor deposition in a process chamber. The invention relates, in particular, to the deposition of an epitaxial layer composed of silicon on a semiconductor wafer composed of monocrystalline silicon, and to an apparatus suitable therefor.

2. Background Art

Semiconductor wafers are often provided with a layer produced by means of vapor deposition. The semiconductor wafer is usually held by a rotating susceptor during deposition of the layer, the susceptor being arranged in a process chamber. Upper and lower covers which are transmissive to thermal radiation and through which radiation energy is transmitted into the process chamber and onto the semiconductor wafer form boundaries of the process chamber. The semiconductor wafer is heated to a specific temperature that is optimal for deposition of the layer. The process chamber furthermore has connections on the side walls for introducing process gas into the process chamber and for discharging process gas and gaseous products of the process gas from the process chamber. The process gas is conducted over the face of the semiconductor wafer that is to be coated. Upon contact with the semiconductor wafer which has been heated to the deposition temperature, process gas is decomposed and the desired layer is deposited on the semiconductor wafer.

It is necessary to clean the process chamber at specific intervals, because it is not possible to completely prevent products of the process gas from depositing in the interior of the process chamber, for example on parts of the susceptor, the inner surface of the upper cover, or the inner side of the side walls. Cleaning is effected by means of vapor phase etching, for example.

Semiconductor wafers cannot be coated during cleaning of the process chamber. Therefore, there is a great interest in having to clean the process chamber as infrequently as possible.

For this reason, EP 0 808 917 A1 recommends controlling the temperature of the walls of the process chamber within a narrow temperature range in a control loop.

It specifically proposes cooling the process chamber by means of a cooling gas from outside and controlling the temperature of the walls by controlling the inflow of cooling gas to a target temperature.

In accordance with U.S. 2007/0042117 A1, control of the temperature of the surface of the process chamber can be extended, for example, by controlling the temperature of the upper cover of the process chamber and the temperature of the lower cover of the process chamber independently of one another. For controlling the temperature of the covers and the temperature of the substrate to be coated, use is made, inter alia, of pyrometers, which measure the temperature of the upper cover on the outer surface of the upper cover, the temperature of the lower cover on the outer surface of the lower cover, the temperature of the substrate in the center of the front side of the substrate and the temperature of the susceptor carrying the substrate. The control loop also comprises a cooling system that conducts a cooling gas against the upper and lower covers.

SUMMARY OF THE INVENTION

The inventor of the present invention has discovered that despite careful control of the temperature of, for example, the surface of the cover of the process chamber, deficiencies can still occur, which affect the properties of the deposited layer or require frequent cleaning of the process chamber. Therefore, an object of the present invention is to reduce the occurrence of such deficiencies. These and other objects are achieved by means of a method for depositing a layer on a semiconductor wafer by vapor deposition in a process chamber having an upper and a lower cover, comprising measuring the temperature on the front side of the semiconductor wafer; heating the semiconductor wafer to a deposition temperature; controlling the temperature of the upper cover of the process chamber to a target temperature, wherein the temperature of the upper cover is measured in the center of the outer surface of the upper cover and is used as an actual value of the controlled variable of a control loop for controlling the temperature of the upper cover; setting a gas flow rate with which a process gas for depositing the layer is conducted through the process chamber; and depositing the layer on the front side of the semiconductor wafer heated to the deposition temperature during the control of the temperature of the upper cover of the process chamber to the target temperature.

BRIEF DESCRIPTION OF THE DRAWINGS

FIG. 1 illustrates schematically an apparatus suitable for use in the method of the invention.

DETAILED DESCRIPTION OF THE PREFERRED EMBODIMENT(S)

The invention provides for measuring the temperature of the upper cover in the center of the outer surface of the upper cover and making this temperature available as an actual value of a controlled variable in a control loop by means of which the temperature of the upper cover is controlled to a target temperature. The target temperature is preferably chosen to lie within an optimum temperature range, which is a temperature range within which the rate at which products of the process gas deposit on the inner surface of the upper cover is lower than in temperature ranges which adjoin the optimum temperature range. The actual temperature of the upper cover is measured in the center of the outer surface of the cover and hence at a location that deviates from the location that is disclosed, for example, in EP 0 808 917 A1.

The present invention takes account of the fact that the coating of the inner surface of the upper cover with products of the process gas begins temporally later in the center of the upper cover than at locations that are distant from the center of the upper cover. The upper and lower covers of the process chamber usually consist of quartz glass, a material that is transmissive to thermal radiation and has a thermal conductivity that is comparatively low. Owing to the latter property, the temperature measured at a location on the outer surface of the upper cover is considerably dependent on the covering of the inner surface of the upper cover at this location by deposits of products of the process gas.

It is therefore advantageous to measure the temperature of the upper cover at a location where there is the lowest probability of the measurement result being corrupted by deposits of products of process gas on the inner surface of the upper cover. This location is the center of the outer surface of the upper cover. Using the measurement of the temperature in the center of the outer surface of the upper cover as an actual value of the controlled variable, the control of the temperature of the upper cover thus ensures that the temperature of the upper cover, regardless of incipient coating of the inner surface of the upper cover, also actually corresponds or virtually corresponds to the target temperature, and thus remains in the optimum temperature range. As a result, this has the effect that the process chamber can be used for depositing a layer on a semiconductor wafer by vapor deposition for a longer period before cleaning has to be effected. If the temperature of the upper cover were measured at a different location, the intervals between two cleanings of the process chamber would have to be shorter.

Preferably, at least one further layer is deposited on at least one further semiconductor wafer before the process chamber is cleaned. The cleaning of the process chamber is preferably effected by means of vapor phase etching.

In accordance with one preferred configuration of the method, the target temperature of the upper cover is chosen in such a way that it correlates with the gas flow rate of the process gas that is set for depositing the layer. This is advantageous because the process gas has a cooling effect on the inner surface of the upper cover. As a result, and owing to the low thermal conductivity of the material of the cover, considerable temperature differences between the temperature on the inner and outer surfaces of the upper cover can occur. The temperature measured on the outer surface of the upper cover is then higher than it would be if the thermal conductivity of the material of the upper cover permitted a rapid temperature equalization. If the cooling effect of the process gas were disregarded in the choice of the target temperature, the temperature on the inner surface of the cover, despite the measures for controlling the temperature of the upper cover, could fall out of the optimum temperature range, and the process chamber would have to be cleaned more frequently as a result.

In accordance with a further preferred configuration of the method, after a cleaning of the process chamber, the amount of material deposited on semiconductor wafers is registered in the form of a total thickness, and the process chamber is cleaned again only when a defined total thickness of material has been deposited. The defined total thickness of deposited material corresponds to the sum of the thicknesses of the layers which are deposited on semiconductor wafers between two cleanings of the process chamber.

Furthermore, provision can be made for cleaning the process chamber again, disregarding the defined total thickness of deposited material after a prior cleaning, for example, when this is advisable on account of the difference between the temperatures on the front side of the semiconductor wafer and on the rear side of the susceptor, particularly when an initial temperature difference that exists during the first deposition the cleaning of the process chamber has changed by more than 5° C. Such a change in the temperature difference can be regarded as an indication that products of the process gas have also deposited in the center of the upper cover on the inner surface of the upper cover. These deposits corrupt the measurement of the temperature of the semiconductor wafer on the front side of the semiconductor wafer. A temperature lying below the true temperature is indicated. Accordingly, the temperature of the semiconductor wafer is already too high if the measurement of the temperature on the front side indicates a temperature corresponding to an envisaged deposition temperature. The measurement of the temperature on the rear side of the susceptor is not impaired by the deposit on the inner surface of the upper cover and indicates the true temperature on the rear side of the susceptor. The increase in this temperature in comparison with the temperature measured on the front side of the semiconductor wafer is therefore an expression of increasing contamination of the inner surface of the upper cover.

In accordance with a further preferred configuration of the method, an epitaxial layer composed of silicon is deposited on a monocrystalline silicon semiconductor wafer by vapor deposition, for example using a mixture of trichlorosilane and hydrogen as process gas.

For the deposition of the epitaxial layer composed of silicon, the process parameters given in the following table are preferably chosen.

TABLE

| Gas flow rate [slm] | Optimum temperature range [° C.] | Second target temperature [° C.] |
|---|---|---|
| 45-55 | 510-530 | 520 |
| 56-65 | 525-545 | 535 |
| 66-80 | 540-560 | 550 |

Gas flow rate in the table denotes the gas flow rate of the process gas that is set for depositing the layer.

If the target temperature were set in a manner deviating from the value in the table to a temperature lying below the lower limit of the optimum temperature range, products of the process gas would deposit as deposits having a white hue more rapidly on the inner surface of the upper cover, and more frequent cleaning of the process chamber would be necessary.

If the target temperature were set in a manner deviating from the value in the table to a temperature lying above the upper limit of the optimum temperature range, products of the process gas would deposit as deposits having a brown hue more rapidly on the inner surface of the upper cover, and more frequent cleaning of the process chamber would be necessary.

Preferably, at least one further epitaxial layer composed of silicon is deposited on at least one further monocrystalline silicon semiconductor wafer, and the amount of material that has been deposited on the semiconductor wafers overall since a last cleaning of the process chamber is registered. The process chamber is cleaned again after the prior cleaning, only when the total thickness of epitaxially deposited silicon, that is to say the defined total thickness of deposited material, is not less than 50 µm, preferably not less than 80 µm.

The abovementioned objects are equally achieved by means of an apparatus for depositing a layer on a semiconductor wafer by vapor deposition, comprising a process chamber having an upper and a lower cover and a first sensor for measuring the temperature of the upper cover in the center of the outer surface of the upper cover, and a controller for controlling the temperature of the upper cover to a predetermined target temperature using the temperature measured by the first sensor as an actual temperature.

Details of a preferred embodiment of the process chamber are explained more specifically below with reference to the figure. The figure shows crucial elements of the invention in a simplified manner.

The process chamber 1 is constructed substantially symmetrically and comprises an upper cover 2, a lower cover 3 and a sidewall 4, which enclose a reactor space, in which a semiconductor wafer is coated by means of vapor deposition.

The semiconductor wafer 5 to be coated is held by a susceptor 6 arranged in the reactor space.

Radiant heating systems 7 and 8 for heating the semiconductor wafer to a specific deposition temperature are situated above the upper cover 2 and below the lower cover 3. Furthermore, connections 9 and 10 for introducing process gas into the process chamber and for discharging process gas and gaseous products of the process gas from the process chamber through the sidewall 4 of the process chamber are present. The process chamber furthermore comprises a cooling system for cooling the upper cover 2 and the lower cover 3, for example a fan 18, which conducts a cooling gas against the upper and lower covers, and heat exchangers 11, which draw heat from the cooling gas heated up in contact with the covers. The direction of movement of the cooling gas is indicated by arrows. The cooling system acts as an actuating device of a control loop for controlling the temperature of the upper cover of the process chamber. A sensor 12 forms a measuring element of the control loop. The sensor 12 is preferably a pyrometer with the aid of which the temperature of the upper cover 2 is measured contactlessly. A controller 19 for controlling the temperature of the upper cover to a predetermined target temperature influences the power of the fan 18 depending on the difference between the temperature measured by the sensor 12 and the target temperature. The control loop is directed, in particular, against disturbances that arise as a result of leaks in the housing of the process chamber. Locations at which such leaks can readily occur are highlighted by dashed circles in the figure.

The sensor 12 is arranged according to the invention in such a way that the temperature of the upper cover 2 in the center of the outer surface of the upper cover is measured thereby. This temperature forms the controlled variable of the control loop. The sensor 12 makes available the actual temperature that is compared with the predetermined target temperature.

The target temperature is preferably predetermined by a data memory 15, in which a plurality of temperature values are stored to which are respectively assigned a gas flow rate of the process gas during deposition of the layer on the semiconductor wafer. The data memory 15 predetermines the temperature value of the target temperature which is assigned to the gas flow rate set for depositing the layer.

The apparatus preferably also comprises a measuring unit 16, which registers how much material has been deposited on semiconductor wafers since a last cleaning of the process chamber, and which, after registering a defined total thickness of deposited material, generates a signal for initiating a next cleaning of the process chamber.

A sensor 13 is provided for measuring the temperature of the semiconductor wafer on the front side of the semiconductor wafer. The front side of the semiconductor wafer is that side area on which the layer is deposited. Furthermore, a sensor 14 is provided, which measures the temperature on the rear side of the susceptor 6. The sensors 13 and 14 are preferably likewise embodied as pyrometers and are part of a control loop for controlling the temperature of the semiconductor wafer by means of a controller 20. The sensor 13 is preferably arranged in such a way that it measures the temperature on the front side of the semiconductor wafer in the center of the front side.

The apparatus preferably also comprises a comparison unit 17, which is integrated in the controller 20 and which compares the temperatures measured by the sensors 13 and 14, and which generates a signal for initiating a next cleaning of the process chamber, if the temperature difference between the temperature measured by the sensor 13 on the front side of the semiconductor wafer and the temperature measured by the sensor 14 on the rear side of the susceptor holding the semiconductor wafer deviates by more than 5° C. from an initial temperature difference. The initial temperature difference is that which exists during the first deposition after the cleaning of the process chamber which directly precedes the next cleaning The controllers 19 and 20, the data memory 15, the measuring unit 16 and the comparison unit 17 can also be parts of an installation control system.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for depositing a layer on a semiconductor wafer by vapor deposition in a process chamber having an upper cover and a lower cover, comprising:
    a) measuring the temperature on the front side of the semiconductor wafer;
    b) heating the semiconductor wafer to a deposition temperature;
    c) controlling the temperature of the upper cover of the process chamber to a target temperature, wherein the temperature of the upper cover is measured in the center of the outer surface of the upper cover and is used as an actual value of a controlled variable of a control loop for controlling the temperature of the upper cover;
    d) setting a gas flow rate at which a process gas for depositing the layer flows through the process chamber; and
    depositing the layer on the front side of the semiconductor wafer during control of the temperature of the upper cover of the process chamber to the target temperature wherein the target temperature of the upper cover is correlated with the process gas flow rate.

2. The method of claim 1, wherein at least one further layer is deposited on at least one further semiconductor wafer, the amount of material that has been deposited on semiconductor wafers since a last cleaning of the process chamber is registered, and the process chamber is cleaned again after the last cleaning when a preselected total thickness of deposited material has been deposited.

3. The method of claim 2, wherein a temperature of a rear side of a susceptor holding the semiconductor wafer is measured, at least one further layer is deposited on at least one further semiconductor wafer, and a next cleaning of the process chamber is initiated, regardless of the defined total thickness of deposited material, in case that the temperature difference between the temperature on the front side of the semiconductor wafer and the temperature on the rear side of the susceptor has changed by more than 5° C. in comparison with an initial temperature difference that exists during the first deposition after the last cleaning of the process chamber.

4. The method of claim 2, wherein the defined total thickness of deposited material is not less than 50 μm when the semiconductor wafer comprises monocrystalline silicon and the deposited material comprises epitaxially deposited silicon.

5. The method of claim 1, wherein an epitaxial layer composed of silicon is deposited on a monocrystalline silicon semiconductor wafer and the target temperature is chosen to lie in a range of 510 to 530° C. when the flow rate of process gas lies in the range of 45 to 55 slm, in a range of 525 to 545° C. when the flow rate of the process gas lies in the range of 56 to 65 slm, and in a range of 540 to 560° C. when the flow rate of process gas lies in the range of 66 to 80 slm.

6. An apparatus for depositing a layer on a semiconductor wafer by vapor deposition, comprising a process chamber having an upper cover and a lower cover and a first sensor for measuring the temperature of the upper cover in the center of the outer surface of the upper cover, and a controller for controlling the temperature of the upper cover to a predetermined target temperature using the temperature measured by the first sensor as an actual temperature and further comprising a data memory, in which a plurality of temperature values are stored, to which are respectively assigned a gas flow rate of process gas during deposition of the layer on the semiconductor wafer, wherein the data memory predetermines a target temperature which is assigned to the set gas flow rate.

7. The apparatus of claim 6, further comprising a measuring unit which registers how much material has been deposited on semiconductor wafers since a last cleaning of the process chamber, and which, after registering a predetermined total thickness of deposited material, generates a signal for initiating a next cleaning of the process chamber.

8. The apparatus of claim 6, comprising a second sensor, which measures the temperature of the semiconductor wafer on the front side of the semiconductor wafer, and a third sensor, which measures the temperature on the rear side of a susceptor holding the semiconductor wafer, and a comparison unit which generates a signal for initiating a next cleaning of the process chamber in case that the temperature difference between the temperature measured by the second sensor and the temperature measured by the third sensor deviates by more than 5° C. from an initial temperature difference that exists during the first deposition after the last cleaning of the process chamber.

* * * * *